United States Patent [19]

Harrington, III

[11] Patent Number: 5,688,722
[45] Date of Patent: Nov. 18, 1997

[54] CMOS INTEGRATED CIRCUIT WITH REDUCED SUSCEPTIBILITY TO PMOS PUNCHTHROUGH

[75] Inventor: Thomas E. Harrington, III, Carrollton, Tex.

[73] Assignee: Dallas Semiconductor Corporation, Dallas, Tex.

[21] Appl. No.: 899,409

[22] Filed: Jun. 16, 1992

Related U.S. Application Data

[63] Continuation of Ser. No. 769,144, Sep. 27, 1991, Pat. No. 5,122,474, which is a continuation of Ser. No. 700,354, May 7, 1991, abandoned, which is a continuation of Ser. No. 555,556, Jul. 18, 1990, abandoned, which is a division of Ser. No. 372,077, Jun. 27, 1989, Pat. No. 4,943,537, which is a continuation-in-part of Ser. No. 210,242, Jun. 23, 1988, Pat. No. 4,906,588.

[51] Int. Cl.$^6$ .................. H01L 21/336; H01L 21/8238
[52] U.S. Cl. .................. 438/217; 438/228; 438/231
[58] Field of Search .................. 437/34, 41, 44, 437/56, 57

[56] References Cited

U.S. PATENT DOCUMENTS

| | | | |
|---|---|---|---|
| Re. 32,800 | 12/1988 | Han et al. | 437/44 |
| 3,305,708 | 2/1967 | Ditrick | 357/23.12 |
| 3,923,553 | 12/1975 | Hayashi et al. | 437/44 |
| 3,996,655 | 12/1976 | Cunningham et al. | 437/44 |
| 4,062,699 | 12/1977 | Armstrong | 437/44 |
| 4,070,687 | 1/1978 | Ho et al. | 437/44 |
| 4,078,947 | 3/1978 | Johnson et al. | 357/23.3 |
| 4,142,926 | 3/1979 | Morgan | 437/44 |
| 4,143,388 | 3/1979 | Esaki et al. | 357/23.3 |
| 4,173,818 | 11/1979 | Bassous et al. | 357/23.3 |
| 4,205,330 | 5/1980 | Klein | 357/23.12 |
| 4,209,349 | 6/1980 | Ho et al. | 437/44 |
| 4,229,756 | 10/1980 | Sato et al. | 357/23.3 |
| 4,236,167 | 11/1980 | Woods | 357/23.12 |
| 4,247,860 | 1/1981 | Tihanyi | 357/23.12 |

(List continued on next page.)

FOREIGN PATENT DOCUMENTS

| | | | |
|---|---|---|---|
| 0024905 | 11/1981 | European Pat. Off. | 357/23.12 |
| 0022480 | 2/1977 | Japan | 357/23.12 |
| 0026666 | 2/1980 | Japan | 357/23.12 |
| 0151363 | 11/1980 | Japan | 357/23.12 |
| 0193065 | 11/1982 | Japan | 357/23.12 |
| 0132483 | 6/1988 | Japan | 437/44 |

OTHER PUBLICATIONS

"Self-Aligned P+ Implanted Regions for Compound Semiconductor FETs", IBM Technical Disclosure Bulletin, vol. 31, No. 4, Sep. 1988, pp. 421-423.

*Primary Examiner*—Mary Wilczewski
*Attorney, Agent, or Firm*—Worsham, Forsythe, Sampels & Wooldridge, L.L.P.

[57] ABSTRACT

A CMOS integrated circuit, in which the PMOS devices each include a buried channel region (26). The P+ source/drain regions (54) and (56) are separated from the channel region (26) by N-type lateral field isolating regions (58) and (60). Whenever a voltage negative enough to turn on the channel is applied, the isolating regions will be inverted by the electric fields from the corners of the gate. Thus, the value of the transistor's threshold voltage is not changed. However, these lateral field isolating regions provide an electric field modification which helps to minimize drain-induced barrier lowering, and thereby reduces the leakage current of the device in the off state. Preferably the lateral field isolating regions are formed by a doping which is maximal at the same depth (below the gate oxide) at which the threshold-voltage-adjust doping of the channel is maximal.

The preferred CMOS process provides lateral field isolating regions on the PMOS devices, and also provides LDD regions on the NMOS devices. The lateral field isolating regions in the PMOS transistors are formed by a blanket N-type implant, and the LDD regions in the NMOS transistors are formed by a patterned implant. Both of these implanting steps are preferably performed after the polysilicon gate layer is encapsulated (by a thin oxide layer), but before the sidewall oxide spacers (which will define a lateral separation between the fate level and the source/drain implant locations) are formed.

6 Claims, 2 Drawing Sheets

U.S. PATENT DOCUMENTS

| | | | |
|---|---|---|---|
| 4,282,539 | 8/1981 | Schrader | 357/23.3 |
| 4,305,201 | 12/1981 | Tielert | 437/44 |
| 4,342,149 | 8/1982 | Jacobs et al. | 437/44 |
| 4,382,826 | 5/1983 | Pfleiderer et al. | 357/23.3 |
| 4,402,761 | 9/1983 | Feist | 437/44 |
| 4,514,897 | 5/1985 | Chiu et al. | 437/44 |
| 4,530,150 | 7/1985 | Shirato | 437/34 |
| 4,577,391 | 3/1986 | Hsia et al. | 437/44 |
| 4,675,981 | 6/1987 | Naruke | 437/41 |
| 4,677,735 | 7/1987 | Malhi | 437/34 |
| 4,697,198 | 9/1987 | Komori et al. | 357/23.3 |
| 4,746,624 | 5/1988 | Cham et al. | 437/44 |
| 4,784,968 | 11/1988 | Komori et al. | 437/34 |
| 4,906,588 | 3/1990 | Harrington, III | 437/44 |
| 4,924,277 | 5/1990 | Yamane et al. | 357/23.9 |
| 4,943,537 | 7/1990 | Harrington, III | 437/44 |

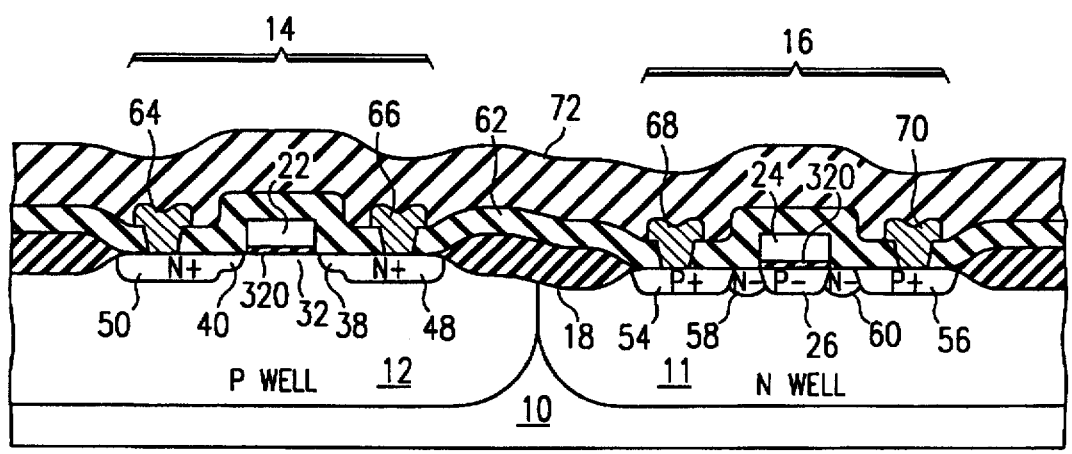
FIG. 5
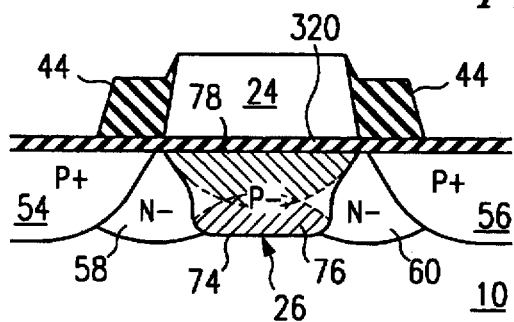
FIG. 6
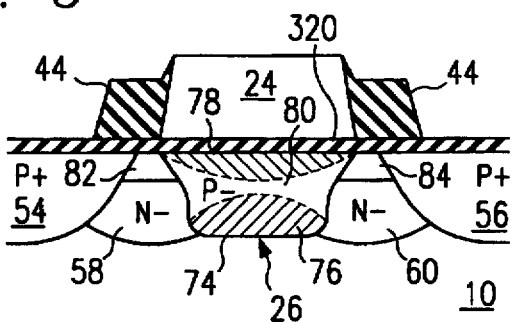
FIG. 7
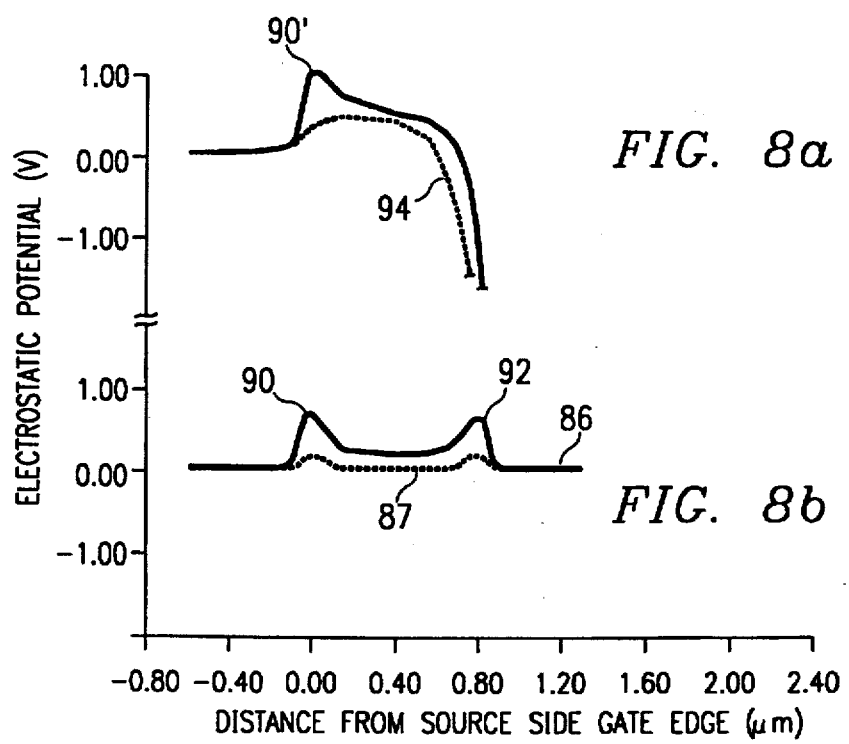
FIG. 8a
FIG. 8b

CMOS INTEGRATED CIRCUIT WITH REDUCED SUSCEPTIBILITY TO PMOS PUNCHTHROUGH

CROSS REFERENCE TO RELATED APPLICATION

The present application is a continuation of, and claims priority to, U.S. patent application Ser. No. 07/769,144, filed Sep. 27, 1991, now U.S. Pat. No. 5,122,474; which is a continuation of U.S. patent application Ser. No. 07/700,354, filed May 7, 1991, now abandoned; which is a continuation of U.S. patent application Ser. No. 07/555,556, filed Jul. 18, 1990, now abandoned; which is a divisional of U.S. patent application Ser. No. 07/372,077, filed Jun. 27, 1989, now U.S. Pat. No. 4,943,537; which is a continuation-in-part of U.S. patent application Ser. No. 07/210,242, filed Jun. 23, 1988, now U.S. Pat. No. 4,906,588.

BACKGROUND AND SUMMARY OF THE INVENTION

The present invention pertains in general to buried channel MOSFETs, and more particularly to buried channel MOSFETs with a short channel length.

In most VLSI CMOS processes, the PMOS devices (of whatever channel length) operate as buried-channel devices. This is due to the difference in work function between the heavily phosphorus-doped polysilicon gate and the channel as the gate oxide thickness is reduced, this work function difference creates a potential gradient, in the crystalline silicon just below the gate oxide interface, which keeps the channel inversion from extending all the way up to the oxide interface (when the transistor is weakly turned on). (In addition, segregation effects will commonly deplete boron dopants from the top 200 or so Angstrom of the channel.)

This effect, and the resulting problems, have been extensively discussed in the literature (see, for example, the IEDM proceedings of 1985, 1986, and 1987). Various attempts have been made to avoid this buried-channel PMOS operation, e.g. by using P-type polysilicon for the gates of the PMOS devices, and N-type polysilicon for the gates of the NMOS devices. However, all such attempts entail additional process complexity.

Thus, many VLSI CMOS processes are now designed to use buried-channel PMOS devices. However, problem arise with buried-channel devices at small geometries (minimum length dose to or less than one micron). For example, such devices tend to have increased susceptibility to punchthrough, since the greater separation between the gate and the channel makes the device more likely to exhibit two-dimensional behavior.

Punchthrough is caused when the electric fields, from the voltage applied on the transistor's drain terminal extend into the channel region and change the profiles of depletion regions there. If a transistor's channel were infinitely long, the electric fields in the middle of the channel would be controlled entirely by the gate; but, as the drain and the source are brought closer together, the fields from the drain also affect the channel. Thus, in a small-geometry buried-channel PMOS device, the surface depletion region under control of the gate my no longer able to fully pinch off the channel region when the drain has a large voltage potential disposed thereon. These changes may allow holes to flow through the buried channel region, even though the gate voltage would not of itself be sufficient to turn the device on. This in effect allows the drain to "punch through" the buried channel region to connect with the source of the transistor.

Even when the transistor is not fully turned on, the electric field contribution of the drain (known as "drain-induced barrier lowering") my cause increased leakage current from source to drain, through the buried channel.

When a MOS transistor receives an applied gate voltage which (for a PMOS device) is greater than its threshold voltage (or, for an NMOS device, is less than the threshold voltage), the transistor will not be fully turned on. However, the transistor will normally conduct a small amount of current ("subthreshold current"), which depends exponentially on the difference between the applied voltage and the threshold voltage. This relation will be dependent on the specific device parameters, but a typical number might be a tenfold current reduction for each 80 milliVolts by which the applied gate voltage exceeds the threshold voltage. In distal circuits this subthreshold current is generally undesirable.

In the fabrication of IGFET (MOS) transistors, techniques of ion implantation into the channel region have been widely utilized, to facilitate processing or to improve the operating parameters of the transistor. For example, channel implants have been utilized to provide threshold voltage adjustment, to reduce punch-through between the source and drain, and for forming a buried-channel device by incorporating within the surface region dopants of the type opposite to that of the substrate dopants.

In the buried channel MOSFET, the conducting channel is in the bulk semiconductor rather than at the Si—$SiO_2$ interface as in a conventional MOSFET. The actual doping profile for the channel region typically has the peak centered in the channel region. Therefore, a surface depletion region is formed at the Si-$SiO_2$ interface, and a junction depletion region is formed about the metallurgical junction (beneath the surface of the substrate). The width of these two depletion regions depends upon the applied voltages. The gate of the transistor modulates the width of the surface depletion region.

A buried channel MOSFET can be fabricated as a normally-on or a normally-off device, depending on the surface doping and junction depth. In a normally-off device, the junction depletion region and the surface depletion region normally touch or overlap to pinch off the buried channel region. The voltage difference between the gate, the Fermi level of the channel region and the Fermi level of the underlying substrate are such that the channel region is depleted of carriers. The gate voltage is then operable to vary the surface depletion region to allow, for example, holes in the P-channel transistor to flow from the source to the drain.

As channel lengths decrease further in MOSFETs, other departures from long channel behavior my occur. These departures (known as short channel effects) arise as a result of a two-dimensional distribution of high electric fields in the channel region. One might consider attempting to avoid these short channel effects by simply scaling down all dimensions and voltages of a long channel MOSFET, so that the internal electric fields are the same. Traditionally, such shrinking would include adjustments to oxide thickness, channel length, channel width, and junction depth. In addition, doping levels are increased by a predetermined scaling factor, and all voltages are reduced by the scaling factor, leading to a reduction of the junction depletion width. As a result, the subthreshold current would be expected to remain essentially the same for the long channel device and the scaled down device. However, there are limitations to the mount of scaling that can be accomplished and, as such, reduction in the channel length with respect to buried channel devices still results in limitations with respect to leakage. In order to further reduce the channel length of the buried-channel transistor, other techniques in addition to scaling will be required.

The present application discloses an innovative circuit device architecture, an innovative transistor structure, and an innovative method for forming a buried channel transistor.

The disclosed innovative integrated circuit structure is a CMOS integrated circuit, in which the PMOS devices each include a buried channel region. The P+ source/drain regions are separated from the channel region by N-type lateral field isolating regions. Whenever a voltage negative enough to turn on the channel is applied, the isolating regions will be inverted by the electric fields from the corners of the gate. Thus, the value of the transistor's threshold voltage is not changed. However, these lateral field isolating regions provide an electric field modification which helps to minimize drain-induced barrier lowering, and thereby reduces he leakage current of the device in the off state. Preferably the lateral field isolating regions are formed by a doping which is mm at the same depth (below the gate oxide) at which the threshold-voltage-adjust doping of the channel is maximal.

The disclosed innovative transistor is a P-channel insulated-gate field-effect transistor which includes N-type lateral field isolating regions interposed between the channel and the P+ some/drain regions. Thus, the lateral field isolating regions are closely coupled to the enhanced electric field at the corners of the gate.

The preferred CMOS process provides lateral field isolating regions on the PMOS devices, and also provides LDD regions on the NMOS devices. The lateral field isolating regions in the PMOS transistors are formed by a blanket N-type implant, and the LDD regions in the NMOS transistors are formed by a patterned implant. Both of these implanting steps are preferably performed after the polysilicon gate layer is encapsulated (by a thin oxide layer), but before the sidewall oxide spacers (which will define a lateral separation between the gate level and the source/drain implant locations) are formed, Many prior VLSI CMOS processes have specified a minimum length, for the P-channel devices, which is slightly longer than the minimun length for the N-channel devices (e.g. 0.2 micron longer). The present invention avoids the need for this disparity in sizes.

Mother way to use the advantages of the present invention is simply to save about 0.2 micron of channel length, for geometries near 1 micron. This is a substantial saving. Moreover, a decrease in minimum channel length confers several other advantages: for a given device width, the drive capability of the device is increased, and the on-state series resistance is decreased, The switching speed of logic circuits is also likely to be increased, A further advantage of the disclosed innovative teachings is that the present invention helps to avoid back-conduction through the channel That is, one of the adverse conditions which integrated circuits commonly encounter is voltages on an external pin which exceed the supply voltage $V_{DD}$. (Such voltages can occur, for example, due to electrical noise picked up by a signal line.) When such an overshoot voltage becomes more than a diode drop above the supply voltage $V_{DD}$, junctions in the substrate will (undesirably) begin to conduct current, and carriers will be injected into the substrate. Such injected carriers can discharge capacitive nodes and/or cause logic gates to switch, so that the chip must be reset. This is undesirable. In practice, this will often occur at voltages which are less than one diode drop above $V_{DD}$.

It has been discovered that such low-voltage upset may be caused by backwards conduction through a PMOS transistor connected to the incoming line. That is, in a typical CMOS output driver configuration, one of the transistor's two P+ diffusions (which would normally act as the PMOS transistor's drain) is connected to the external line, and the other is connected to the power supply $V_{DD}$. The N-well is also typically connected to $V_{DD}$. Now, suppose that the gate voltage happens to be at approximately $V_{DD}$-$V_{TP}$. In this case, when the P+ drain diffusion is pulled above $V_{DD}$, this may turn on the transistor, with a direction of flow which is opposite to its normal direction of current flow. This backwards conduction my undesirably pull up the potential of other nodes in the chip.

It has been experimentally discovered that the present invention provides added an margin of protection against such $V_{DD}$ overshoot on I/O lines. Thus, integrated circuits which include PMOS transistor structures as disclosed and claimed herein are better able to withstand applied voltages in excess of $V_{DD}$, without reverse-buried-channel leakage to the source.

A further innovative teaching disclosed herein is that the peak doping concentration of the lateral field isolating regions are preferably formed by a doping which is maximal at the same depth (below the gate oxide) at which the threshold-voltage-adjust doping of the channel is maximal.

This retrograde profile of the lateral field isolating regions has the further advantage that gate-induced inversion of these regions can easily occur near their upper boundary (so that the device threshold voltage is not increased), while the more heavily doped lower portions of these regions help to minimize the width of the depletion regions extending from the gate.

It should be noted that the operation of the lateral field isolating regions is, in some ways, exactly opposite to that of the lightly-doped drain extension regions (LDD regions) commonly used in VLSI processing. LDD regions reduce hot carrier generation, by reducing the peak electric field magnitude, by increasing the width of the depletion region at the drain boundary. By contrast, the lateral field isolating regions provided by the innovative teachings herein decrease the width of the depletion region at the drain boundary, which necessarily means that the peak electric field magnitude at the drain boundary will be increased. However, hot carrier generation is much more a problem in NMOS devices than in the PMOS devices, and the present invention recognizes that advantages can be obtained by going contrary to the conventional teachings, in the PMOS devices only.

A further innovative teaching disclosed herein is an advantageous combination of steps in a CMOS process. The preferred process provides lateral field isolating regions on the PMOS devices, and also provides LDD regions on the NMOS devices. Preferably the lateral field isolating regions are formed at a point in the process flow which is close to the time when LDD regions are formed on the NMOS devices: Preferably both are formed after the polysilicon gate layer is encapsulated (by a thin oxide layer), but before the sidewall oxide spacers (which will define a lateral separation between the gate level and the source/drain implant locations) are formed.

BRIEF DESCRIPTION OF THE DRAWING

The present invention will be described with reference to the accompanying drawings, which show important sample embodiments of the invention and which are incorporated in the specification hereof by reference, wherein:

FIG. 5 illustrates the step of forming the metal interconnect layer;

FIG. 6 illustrates a cross-sectional diagram of the buried channel transistor and the depletion regions in the buried channel;

FIG. 7 illustrates the depletion regions of the transistor of FIG. 6 with a conductive channel formed therein; and FIGS. 8a and 8b illustrate potential diagrams of the channel region of the buried channel transistor.

Figure 1:
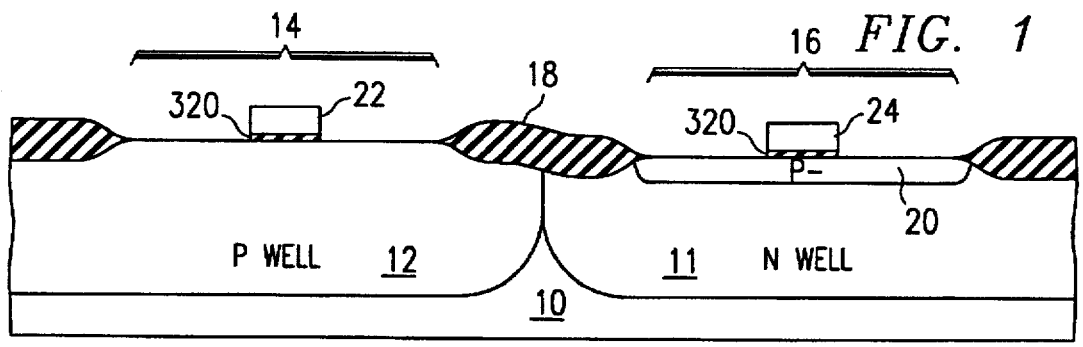
FIG. 1 illustrates a cross-sectional diagram of a twin tub CMOS process after formation of the polysilicon gates in the transistors.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

EMBODIMENTS OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Referring now to FIG. 1, there is illustrated a cross-sectional diagram of a semiconductor substrate 10 having an N-type conductivity in which a P-well 12 is formed by a conventional process. An active area 14 is formed in the P-well 12 in which N-channel transistors will be formed, and an active area 16 is formed in the N-type substrate 10 outside of the P-well 12 in which P-channel transistors will be formed A layer of field oxidation 18 is provided on the surface of the substrate 10 for separating the two active regions 14 and 16. After forming the P-well 12, the NMOS active region 14 is masked off with photoresist, and acceptor dopants are introduced into the PMOS active region 16 to a dosage of approximately 3E12 ion/cm$^2$, resulting in a concentration of approximately 10$^{16}$ ion/cm$^3$. This forms a layer 20 of acceptor dopants in the surface of an N-type substrate 10. The acceptor dopants utilized are boron.

After formation of the layer 20, a layer of gate oxide is thermally grown over both the NMOS active region 14 and the PMOS active region 16. A conformal layer of polycrystalline silicon (POLY) is then deposited on the substrate and etched to form an N-channel gate 22 in the NMOS active region 14 and a P-channel gate 24 in the PMOS active region 16.

Figure 2:
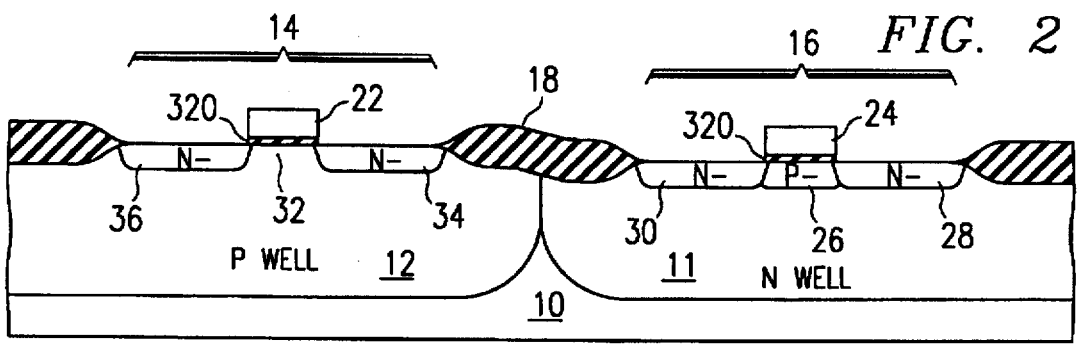
FIG. 2 illustrates the step of implanting phosphorous into the source and drain regions on either side of the gate of both the N- and P-channel transistors.

Referring now to FIG. 2, after formation of the P-type layer 20 in the PMOS active region 16, the NMOS active region 14 is exposed and donor dopants, which, in the preferred embodiment are phosphorous, are implanted into the active regions 14 and 16 on either side of the gates 22 and 24. The gates 22 and 24 provide a self-alignment process which is well-known in the art. In the PMOS active region 16, the donor dopants have a higher concentration than the acceptor dopants, resulting in N-type regions formed on either side of the gate 24. This defines a buried channel region 26 defined under the P-channel gate 24, which channel region 26 is comprised of acceptor dopants. The buried channel region 26 is bounded on either side by an N-region 28 and an N-region 30. In a similar manner, the NMOS active region 14 has a channel region 32, formed under the N-channel gate 22, which includes acceptor dopants provided by the background doping of the P-well 12. The channel region 32 is bounded on either side by an N-region 34 and an N-region 36. The N-regions 28 and 30 and 34 and 36 have a concentration of approximately 10$^{17}$ ion/cm$^3$, as a result of the implant step wherein the dosage was approximately 5E12 ions/cm$^2$. As will be described hereinbelow, the existence of the N-regions 28 and 30 in the PMOS active region 16 provide a departure from the standard processing of a buried P-channel transistor.

Figure 3:
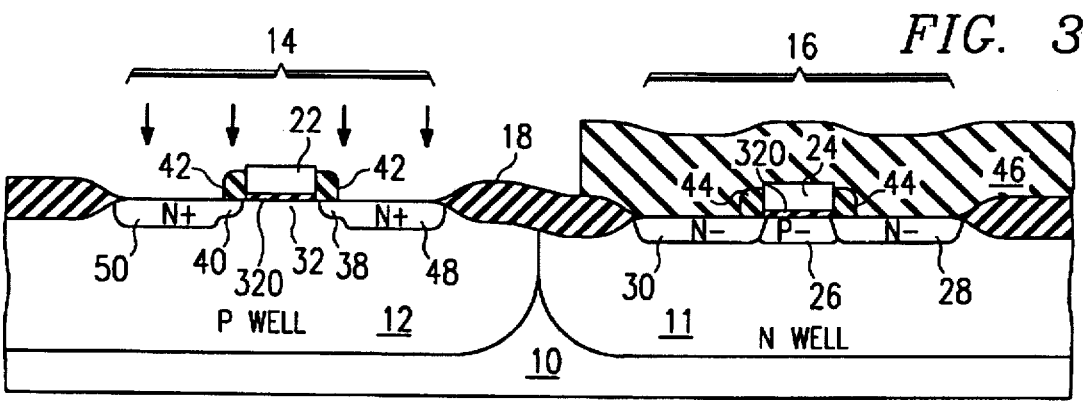
FIG. 3 illustrates the step of forming the some and drain regions for the N-channel transistor.

Referring now to FIG. 3, after formation of the N-regions 28 and 30, the PMOS active region 16 is masked off with a layer of photoresist (not shown) and the N-regions 34 and 36 in the NMOS active region 14 exposed. An additional phosphorous ion implantation is made into the NMOS active region 14 to increase the concentration of donor dopants for the purposes of fabricating a lightly doped drain (LDD) transistor. The dosage for an LDD transistor is higher than the desired concentration of the N-regions 28 and 30 and, as such, it is necessary to provide this additional step. This results in the N-regions 38 and 40 on either side of the channel region 32.

After performing the LDD implant into the regions 34 and 36, the photoresist is removed and sidewall oxide spacers 42 are formed on the vertical surfaces of N-channel gate 22 and sidewall oxide spacers 44 are formed on the vertical surfaces of P-channel gate 24. Although not illustrated in detail, fabrication of the sidewall oxide spacers 42 and 44 is achieved by first depositing a conformal layer of oxide over the substrate to a predetermined thickness. This oxide layer is then anisotropically etched in the vertical direction to remove the oxide from all surfaces which are essentially horizontal. This leaves the oxide on the essentially vertical surfaces. The fabrication of sidewall oxide spacers is well-known in the art.

After formation of the sidewall oxide spacers 42 and 44, a layer of photoresist is deposited on the substrate and patterned to form a photoresist layer 46 covering the PMOS active region 16. Arsenic is then implanted into the substrate to form the source and drain regions of the N-channel transistor. The spacers 42 on the N-channel gate 22 provide the function of spacing the source/drain implants away from the channel region 32. This results in source/drain regions 48 and 50 with an LDD region 38 extending from the source/drain region 48 to the channel region 32, and an LDD region 40 extending from the source/drain region 50 to the channel region 32.

Figure 4:
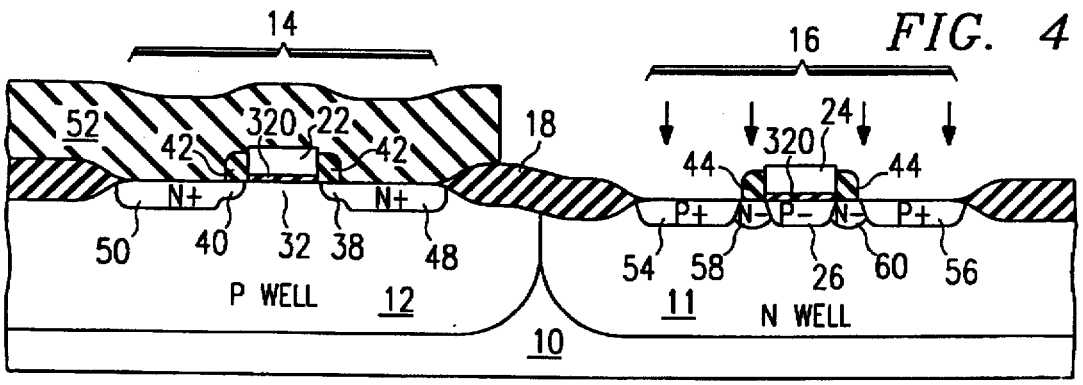
FIG. 4 illustrates the step of forming the source and drain regions for the P-channel transistor.

Referring now to FIG. 4, after implanting of the source/drain regions 48 and 50 for the N-channel transistor, the photoresist layer 46 is stripped off and the NMOS active region 14 is then covered by a layer of photoresist 52. This causes the PMOS active region 16 to be expose& A boron implant of a dosage suitable for a source/drain region is then performed, resulting in P+ regions 54 and 56 being formed on either side of the P-channel gate 24 and separated from the edges thereof by the spacers 44. This results in an N- lateral field isolating region 58 being formed between the P+ region 54 and the buffed channel region 26 and an N- lateral field isolating region 60 being formed between the P+ region 56 and the buffed channel region 26. As will be described hereinbelow, the lateral field isolating regions 58 and 60 act to enclose the buffed channel region 26 and provide a potential barrier thereto.

Referring now to FIG. 5, after formation of the lateral field isolating regions 58 and 60, the photoresist layer 52 is removed and then oxide deposited at low temperature to provide the POLY/metal interlevel oxide layer, designated by a reference numeral 62. The substrate is then subjected to a thermal cycle for oxide reflow and the source/drain activation/drive step. Vias are then formed in the layer 62 and contacts 64, 66, 68 and 70 formed therethrough to contact the some/drain regions 50 and 48 and the source/drain regions 54 and 56 respectively. Although not shown, vias are also formed through the interlevel oxide layer 62 to expose a portion of the POLY gates 22 and 24 for interconnection thereto. Thereafter, a passivation layer 72 is formed over the substrate.

Referring now to FIG. 6, there is illustrated a detail of the buffed channel region 26 and the source/drain regions 54 and 56 on either side thereof. It can be seen that the buffed channel region 26 is totally enclosed on either side thereof by the N– lateral field isolating regions 58 and 60 such that there is a PN junction formed between the P+ regions 54 and 56 and the buffed chancel region 26 of the P-channel transistor. The device illustrated in this embodiment is a normally-off device, such that no current flows when the applied gate voltage is below the threshold voltage $V_T$.

The buried channel region 26 has a metallurgical junction 74 formed between the buried channel region 26 and the N-type substrate 10. There is a junction depletion region 76 associated with the metallurgical junction 74 and a surface depletion region 78 associated with the Si—SiO$_2$ interface. With subthreshold voltages applied to the gate, the surface depletion region 78 overlaps the junction depletion region 76, thus inhibiting current flow through the buried channel region 26. This is the way in which a conventional buried channel transistor is turned off. In order to turn on a conventional buried channel transistor, the gate voltage is increased to a level greater than the threshold voltage, such that the surface depletion region 78 is pulled away from the junction depletion region 76 and holes allowed to conduct through the buried channel region 26, thus forming a buffed channel.

When the transistor is turned off, the only current being conducted through channel region 26 is leakage current. When a MOS transistor receives an applied gate voltage which is less than its threshold voltage, the transistor will normally conduct a small mount of current, which depends exponentially on the difference between the applied voltage and the threshold voltage. This relation will be dependent on the specific device parameters, but a typical number might be a tenfold current reduction for each 80 milliVolts by which the applied gate voltage exceeds the threshold voltage.) In digital circuits this subthreshold current is generally undesirable.

However, one problem with short channel transistors is that the fields from the drain of the transistors may extend into the buried channel region 26 and change the profiles of depletion regions 76 and 78. These changes may allow holes to flow through the buffed channel region 26. This in effect allows the drain to "punch through" the buffed channel region to connect with the source of the transistor.

When a large potential is applied to a junction-isolated diffusion in a semiconductor, the resulting fields (added to the "built-in potential" of the junction) will increase the width of the depletion region which surrounds the junction In particular, when a large negative voltage (e.g. 5V or 3.3V) is applied to the drain of a P-channel transistor (with a gate voltage of zero), the depletion region of the drain junction will not only extend vertically (downward into the substrate 10), but will also extend horizontally in all directions outward from the drain of the transistor, including toward or into the channel of the transistor.

By utilizing the lateral field isolating regions 58 and 60, the width of the depletion region in the horizontal direction extending from the drain of the transistor to the buried channel region is decreased. This reduces the effect that the depletion region on the drain of the transistor has on the buried channel region 26 as a result of a large negative voltage on the drain of the transistor. Specifically, these lateral field isolating regions prevent punchthrough from occurring at a drain voltage which otherwise would have caused punchthrough (although punchthrough can still occur at a sufficiently large applied drain voltage). Similarly, the subthreshold current due to drain-induced barrier lowering will be lower than it otherwise would, for a given set of applied voltages and a device parameters.

Of course, a sufficiently wide and/or heavily doped N-type isolating region would be able to completely prevent the drain potential from punching through the channel However, such a heavily doped N-type region could also would be incapable of being inverted without applying a large gate voltage, that is, the device threshold would be increased to an unacceptable value. Therefore, the doping level of the isolating regions 58 and 60 is chosen to provide the maximum isolation while still being invertible by a reasonable threshold voltage.

Thus, one advantage of the present invention is that immunity to punchthrough can be enhanced, and subthreshold current can be decreased, without degrading transistor dimensions, and without increasing the threshold voltage of the device.

Referring now to FIG. 7, there is illustrated the normal operation, wherein the surface depletion region 78 is pulled away from the junction depletion region 76 when the gate voltage is above the threshold voltage $V_T$. This results in a channel 80 being formed through the buried channel region 26 and disposed between the junction depletion region 76 and the surface depletion region 78. In addition, the surfaces of the N–region 58 and the n-region 60 are inverted to form surface inversion regions 82 and 84, respectively. The formation of these inverted regions 82 and 84 results in the $V_T$ of the transistor being raised slightly higher than would be expected. However, any problems caused by the additional $V_T$ of the transistor are minimized compared to advantages provided by the isolation realized between the P+ regions 54 and 56 and the buried channel region 26.

As the examples of FIGS. 6 and 7 show, it is most preferable that the depth of the isolating region 58 is, in the presently preferred embodiment, comparable to that of the lower channel junction 74 and to that of some/drain regions 54 and 56.

Moreover, a further important teaching is that the depth of peak concentration of the N-type isolating regions 58 and 60 is approximately equal to the depth of peak net concentration of the channel (which is also the depth at which conduction will predominantly occur when the channel first turns on). In the presently preferred embodiment, the peak concentration of the N-type isolating regions 58 and 60 is about 1.7E17 cm$^{-3}$ (net) at a depth of about 0.12 microns (below which it gradually changes toward the concentration of the well region 11, which is about 5E16 cm$^{-3}$ at the surface, and increases with depth). The peak concentration of the channel region 26 is about 2E16 cm$^{-3}$ (net) P-type, and its lowest junction depth is about 0.25 microns. The $V_T$-adjust ion implant, in the presently preferred embodiment, has a stopping depth of about 0.12 microns below the gate oxide. In addition, the boron concentration is sharply depleted at the surface (to a depth of about 200 Angstroms), due to boron segregation into the gate oxide. The lowest junction depth of the source/drain regions 54 and 56 is about 0.25 microns, and their peak concentration is very high (in excess of 1E20 cm$^{-3}$. (Of come, it will be recognized by those skilled in the art that junction depths in a VLSI process are inherently subject to some random variation; these numbers are provided merely for illustration, and are not intended to be definitive.)

During normal operation, it is only necessary that there be a conducting channel between the source and drain region and the buried channel region 80, as is realized with the inverted regions 82 and 84. If a very narrow conductive region could be realized between the source and drain regions and the buried channel region 26, a much higher concentration of donor dopants could be utilized for the lateral field isolating regions 58 and 60. This higher level of dopants would further reduce the effect of the transverse electric fields extending from the drain of the transistor into the channel region 26. To this extent, the upper portion of the source and drain regions could overlap with the upper portion of the buried channel region 26, as long as at least a portion of the drain was isolated from the buried channel region 26 by lateral field isolating regions 58 and 60.

Referring now to FIGS. 8a and 8b, there are illustrated plots of the electrostatic potential along the channel from the source to the drain of the transistor of FIG. 7, wherein potential is plotted as a function of distance from the source side to the gate edge in microns. Curves 86 and 87 represent the operation of the buried channel device of the present invention with a gate voltage of −5.0 volts and a drain voltage of −0.05 volts. Curve 86 illustrates the potential at a depth of 0.056 microns and curve 87 represents the potential at the surface. This represents the on condition with strong channel inversion. A curve 88 illustrates the condition where the gate voltage is 0.0 volts and the droop voltage is −5.0 volts, representing a possible punch-through condition. It can be seen that curve 86 has a potential across the channel that is not flat. There are two potential "hills" 90 and 92, potential hill 90 occurring on the source side of the transistor and potential hill 92 occurring on the drain side of the transistor. These are due to the doping in regions 58 and 60, making it more difficult for holes to pass directly from some and drain into the middle of the buried channel Holes must instead pass into the channel region by traveling along the surface inversion regions 82 and 84, where the potential hills are much smaller, as illustrated in curve 87.

When the drain voltage is much lower than the gate voltage, thus providing a large potential on the drain side of the transistor, the potential hill provided by the isolating regions 58 and 60 on the dr side provide a potential barrier to the middle of the channel in order to conduct through the channel This is to be compared with the operation of the transistor without the isolating regions 58 and 60, as illustrated by the curve 94 in phantom. It can be seen that the curve 94 has a lower electrostatic potential across the channel, and therefore, some increased leakage current will occur.

In summary, there has been provided an enclosed buried channel device wherein N-regions are disposed between the P- buried channel region and the P+ source/drain regions. The N-regions provide an isolation when the transistor is turned off and a large drain potential is present. The lateral field isolating regions prevent disruption of the surface depletion region within the buried channel region, thus preventing leakage current flowing therethrough.

Further Update of Preferred Embodiment

To further illustrate how the invention is presently most preferably practiced, as of the date of this daughter application, the following sample process flow is provide:

A sample process flow for fabricating this SRAM is as follows. This process flow is included to provide extremely clear disclosure of the best mode as presently practiced. However, it should be recognized that, as of the filing date of the present application, the following is not an established production process. As is well known to those skilled in the art of semiconductor manufacturing, processes may be extensively modified in the transfer to production. A tremendous variety of modifications could be made in this process flow, as will readily be recognized by those skilled in the art.

This sample process flow is as follows:

1.) The starting wafer is a (100) oriented wafer, doped N-type to a resistivity of about 20 to 40 ohm-centimeters. After clean-up, an initial oxide is grown to about 950 Ångstroms, and about 1,500 Ångstroms of silicon nitride is then deposited over the oxide. Photoresist is then deposited, and patterned according to the N-well pattern. Exposed portions of the nitride are then etched away by plasma etching, and phosphorus is implanted to dope the N-well. In this sample embodiment, phosphorous is implanted at 175 keV at a dosage of 8.5×10$^{12}$ cm$^{-2}$. A first field oxide is then grown to about 5,500 Ångstroms. (Note that this field oxide will grow generally in places which were exposed by the N-well mask, where phosphorous was implanted.) The remaining silicon nitride is then cleared, and boron is implanted to dope the P-well areas. (The first field oxide, which is thick over the N-well areas, will keep this implant out of the N-well areas.) In this sample embodiment, the P-well boron dose is 5.0×10$^{12}$ at 100 keV. A long high-temperature drive step will then be performed to drive in the N-well and P-well dopings (for example about 250 minutes at about 1150 degrees C). The first field oxide is then stripped. This completes the formation of the N-well and P-well regions, in which the PMOS and NMOS active devices (respectively) will be formed. The resulting junction depth of the P-wells will be about 4 microns. The added doping of the N-type wells will taper off into the substrate doping at about the same depth.

2.) The active device areas will now be fabricated. First, a pad oxide is grown, to about 600 ÅAngstroms, and nitride is deposited, to about 1,500 Ångstroms. Photoresist is deposited and patterned, so that the areas where active devices will be desired are covered, and remaining areas are exposed. A plasma etch is now used to strip the nitride from these areas. The photoresist is now stripped, and another layer of photoresist is deposited and patterned to expose only the regions where channel stops for the NMOS devices are desired. Boron is now implanted, e.g. at 30 keV at a dosage of 1.1×10$^{14}$ per centimeter squared, and the photoresist is then stripped, A high temperature oxidation is now performed, to grow field isolation oxide to a thickness of about 5,900 ÅAngstroms. A plasma etch now removes the remaining silicon nitride portions.

3.) The next steps form the active devices.

3.a.) A sacrificial gate oxide is now grown to a thickness of about 350 Ångstroms. A blanket implant is now performed to adjust the threshold voltages of the active devices. In the presently preferred embodiment, this $V_T$-adjust implant is 20 keV Boron at a dosage of $3.0 \times 10^{12}$ per centimeter squared. The sacrificial oxide is now stripped.

3.b.) The slice is again cleaned up, and the final gate oxide 320 is grown. In the presently preferred embodiment, this oxide is grown to 225±25 Ångstroms, at a temperature of 950 degrees C in a dry atmosphere which includes argon, oxygen, and a chlorinating agent such as TCA.

3.c.) A polysilicon layer is now deposited, to a thickness of about 4,000 Ångstroms, and phosphorus doped (e.g. by $POCl_3$ deposition), to a net sheet resistance of about 10 ohms per square. (The sheet resistance will be higher after the subsequent thermal cycling.) After clean-up, photoresist is deposited and patterned to expose the areas where the polysilicon layer is desired to be removed. A short oxide etch is applied, to clear native oxide from the exposed areas of polysilicon, and a silicon etch is then performed to clear the polysilicon from the undesired areas. The photoresist is then removed. A short oxidation is now performed, to passivate the exposed surfaces of the polysilicon layer.

3.d.) N-type dopants are now implanted into the active regions 14 and 16 on either side of the gates 22 and 24. (This implant is performed, in the presently preferred embodiment, with phosphorus ions, at an area-specific dose of 5E12 $cm^{-2}$, and an energy of 100 keV.) In the PMOS active region 16, this implant creates regions 28 and 30 of enhanced N-type doping on either side of the PMOS channel region 26 under the gate 24. In a similar manner, the NMOS active region 14 has a channel region 32, formed under the N-channel gate 22, which is now bounded on either side by an N−regions 34 and 36. (If a much larger energy were used for this implant, the threshold voltages of the thick-field parasitic devices might be degraded.)

3.e.) The PMOS active region 16 is now masked off with a layer of photoresist (not shown), and an additional phosphorous ion implantation is made into the NMOS active region 14. This implant further increases the concentration of donor dopants adjacent the NMOS channels 32, for the purposes of fabricating lightly doped drain extension regions (LDD regions) on the NMOS transistors. This implant is performed, in the presently preferred embodiment, with phosphorus ions, at an area-specific dose of 3E13 $cm^{-2}$, and an energy of 100 keV. This forms the N- LDD regions 38 and 40 bounding either side of the channel region 32. As discussed elsewhere, these LDD regions are slightly retrograded, with a peak concentration at a depth of about 0.12 microns.

3.f.) After the LDD implant, the photoresist is removed, and sidewall oxide spacers 42 are formed on the vertical surfaces of N-channel gates 22 and P-channel gates 24. Although not illustrated in detail, fabrication of the sidewall oxide spacers 42 and 44 is a well-known process, and is achieved by first depositing a conformal layer of oxide over the substrate to a predetermined thickness (of 2500 Angstroms, in the presently preferred embodiment). This oxide layer is then anisotropically etched in the vertical direction to at least 100% of its vertical thickness. This removes the oxide from all surfaces which are essentially horizontal, and leaves the oxide on all surfaces which are essentially vertical 3.g.) After formation of the sidewall oxide spacers 42 and 44, a layer of photoresist is deposited on the substrate and patterned to form a photoresist layer 46 covering the PMOS active region 16. Arsenic is then implanted into the substrate to form the source and drain regions of the N-channel transistors. This implant is performed, in the presently preferred embodiment, with arsenic ions, at an area-specific dose of 5E15 $cm^{-2}$, and an energy of 50 keV. The sidewall oxide spacers 42, like the N-channel gate 22, protect the underlying substrate regions from this implant. Thus, this implant results in shallow N+ source/drain regions 48 and 50 being spaced away from the NMOS channel regions 32. The LDD regions 38 and 40 (which are more lightly doped than the source/drain regions 48 and 50) extend from the some/drain region 50 to the channel region 32.

3.k) The photoresist layer 46 is now stripped, and the NMOS active region 14 is covered by a layer of photoresist 52. This causes the PMOS active region 16 to be exposed. A boron implant of a dosage suitable for a source/drain region is then performed, resulting in P+ regions 54 and 56 being formed on either side of the P-channel gate 24 and separated from the edges thereof by the spacers 44. This implant is performed, in the presently preferred embodiment, with B+ions, at an area-specific dose of 3E15 $cm^{-2}$, and an energy of 20 keV. This results in an N-lateral field isolating region 58 being formed between the P+ region 54 and the buried channel region 26, and an N-lateral field isolating region 60 being formed between the P+ region 56 and the buried channel region 26.

4.) The foregoing steps essentially complete the formation of the active devices. The remaining steps are primarily directed to interconnect and hermeticity.

4.a.) An interlevel oxide is now formed, e.g. by low-temperature oxidation to deposit 500 Ångstroms of undoped silicate glass, followed by 5500 Ångstroms of phosphorus-doped silicate glass. (Alternatively, this can be done using "spin-on glass" (a widely used sol-gel composition which, when baked, provides a silicate glass). This interlevel oxide is then densified and reflowed, to provide a cleaner surface for subsequent steps.

4.b.) Another level of photoresist is now deposited and patterned, to expose locations where contacts are desired to be formed. A long oxide etch is now performed, to etch down to the substrate at contact locations. The photoresist is then stripped.

4.c.) The metal layer will now be formed. In the presently preferred embodiment, 8,000 Ångstroms of aluminum alloy is deposited, patterned, and etched, to provide metal connecting lines in a desired pattern.

4.d.) Protective overcoat deposition and bond pad etch can then be performed according to conventional technology, to complete fabrication of the device.

Of course, the foregoing process flow is merely illustrative, and can be widely modified and varied. It will he readily recognized by those skilled in the VLSI art that all process parameters can be varied, and that alternative process steps or device structures can easily be substituted for most of the steps and structures specified.

Thus, it must be understood that the foregoing specific description is intended merely to provide an example of how the invention could be implemented, and does not by any means state necessary features of the claimed inventions.

One example of variation is in the width of the sidewall oxide filaments (which, together with the diffusion length of the some/drain doping, defines the offset of the source/drain regions from the gate corners. The width of these filaments can be adjusted, within limits, by changing the thickness of the conformal oxide deposition, and/or by changing the degree of overetch used after the conformal oxide is cleared, and/or by performing multiple conformal deposition and etchback steps. Thus, the width of these spacers can readily be adjusted. The only limits on this adjustment are provided by the functionality described above: if the sidewall oxide width is reduced too far, the relatively light concentration of the lateral field isolating regions could be swamped by the lateral diffusion from the source/drain regions. Conversely, if the sidewall oxide were made extremely wide (e.g. by multiple filaments), to the point where some portions of the lateral field isolating regions were not well coupled to the fringing fields at the gate corners, the threshold voltage of the PMOS devices would be increased.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the various implants discussed could each be performed by multiple implanting steps. As is well known in the art of VLSI process design, the use of multiple implants, with different stopping depths, provides a technique to broaden the Gaussian peak which would otherwise result from a single implanting step.

Of course, the disclosed process steps and structure can be used for depletion-mode as well as for enhancement-mode devices. Similarly, the disclosed process steps could also be adapted for use where the PMOS channel 26 was not actually P-type (although this is much less preferable). Similarly, the doping parameters of the N-well 11 can be widely varied.

As will be recognized by those skilled in the art, the innovative concepts described in the present application can be modified and varied over a tremendous range of applications, and accordingly their scope is not limited except by the allowed claims.

What is claimed is:

1. A method for fabricating a CMOS integrated circuit, comprising the steps of:

a.) providing a semiconductor body with monocrystalline semiconductor well regions near the surface thereof, first ones of said well regions being predominantly doped P-type, and second ones of said well regions being predominantly doped N-type, isolation regions being disposed to prevent conduction between ones of said well regions;

b.) implanting a dosage of acceptor dopants into said second well regions which is sufficient to set the threshold voltage of PMOS transistors to an approximately predetermined value, said implanting being performed with a stopping distance which is selected to provide a predetermined buried channel depth;

c.) providing a gate dielectric layer over said well regions, and forming a thin film gate electrode in a predetermined pattern over said semiconductor body, some portions of said gate electrode extending over portions of said first well regions to define NMOS channel regions therein, and other portions of said gate electrode extending over portions of said second well regions to define PMOS channel regions therein;

d.) encapsulating all exposed surfaces of said gate electrode;

e.) implanting donor dopants into both said first and second well regions, to form N-type lateral field isolation regions near the surface of said second well regions adjacent to said PMOS channel regions therein said implanting step being performed with a stopping depth which will provide a maximum net concentration of N-type dopants at approximately the same depth as said buried channel depth;

f.) introducing donor dopants into said first well regions only, to form lightly-doped-drain-extension regions near the surface of said first well regions adjacent to said NMOS channel regions therein;

g.) forming spacer filaments on the sidewalls of said gate electrode;

h.) forming P-type source/drain regions in portions of said second well regions which are not covered by said gate electrode nor by said spacer filaments, ones of said PMOS channel regions being separated from respectively adjacent ones of said P-type source/drain regions by respective ones of said lateral field isolation regions; and i.) forming N-type source/drain regions in portions of said first well regions which are not covered by said gate electrode nor by said spacer filaments, ones of said NMOS channel regions being separated from respectively adjacent ones of said N-type source/drain regions by respective ones of said lightly-doped-drain extension regions;

wherein said step d) is performed before said steps e) and f).

2. The method of claim 1, wherein said spacer filament is a filament of silicon dioxide.

3. The method of claim 2 wherein said step of introducing dopants to form said lateral field isolation regions applies a dose of dopants which is in the range of 0.3 to 1.0 times the maximum dose which would prevent said lateral field isolation regions from being inverted when a voltage is supplied to said gate electrode which is just sufficient to turn on said PMOS channel regions.

4. The method of claim 1, wherein said step of introducing dopants to form said lateral field isolation regions applies a dose of dopants which is in the range of 0.3 to 1.0 times the maximum dose which would prevent said lateral field isolation regions from being inverted when a voltage is supplied to said gate electrode which is just sufficient to turn on said PMOS channel regions.

5. The method of claim 1, wherein said semiconductor body consists essentially of silicon, and said gate dielectric consists essentially of silicon dioxide.

6. The method of claim 1, wherein said insulated gate electrode comprises heavily doped N-type polysilicon.

* * * * *

UNITED STATES PATENT AND TRADEMARK OFFICE
CERTIFICATE OF CORRECTION

PATENT NO. : 5,688,722
DATED : November 18, 1997
INVENTOR(S) : Thomas E. Harrington, III It is certified that error appears in the above-identified patent and that said Letters Patent is hereby corrected as shown below:

Title page,
Item [57], ABSTRACT,
Line 7, replace "comers" with -- corners --
Line 27, replace "fate" with -- gate --

Column 1,
Line 34, replace "Angstrom" with -- Angstroms --
Line 45, replace "problem" with -- problems --
Line 47, replace "dose" with -- close --
Line 61, replace "my" with -- may --

Column 2,
Line 3, replace "my" with -- may --
Line 15, replace "distal" with -- digital --
Line 50, replace "my" with -- may --
Line 65, replace "mount" with -- amount --

Column 3,
Line 17, replace "he" with -- the --
Line 19, replace "mm" with -- maximal --
Line 24, replace "some" with -- source --
Line 38, replace "formed," with -- formed. --
Line 41, replace "minimun" with -- minimum --
Line 44, replace "Mother" with -- Another --
Line 51, replace "increased, " with -- increased. --

Column 4,
Line 11, replace "my" with -- may --

Column 5,
Line 4, replace "some" with -- source --
Line 25, first occurrence, replace "EMBODIMENTS" with -- DESCRIPTION --

UNITED STATES PATENT AND TRADEMARK OFFICE
CERTIFICATE OF CORRECTION

PATENT NO.   : 5,688,722
DATED        : November 18, 1997
INVENTOR(S)  : Thomas E. Harrington, III It is certified that error appears in the above-identified patent and that said Letters Patent is hereby corrected as shown below:

Column 6,
Line 60, replace "expose&" with -- exposed. --
Line 66, replace "buffed" with -- buried --

Column 7,
Line 1, replace "buffed" with -- buried --
Line 3, replace "buffed" with -- buried --
Line 13, replace "some" with -- source --
Line 20, replace "buffed" with -- buried --
Line 21, replace "buffed" with -- buried --
Line 25, replace "buffed chancel" with -- buried channel --
Line 44, replace "buffed" with -- buried --
Line 50, replace "mount" with -- amount --
Line 62, replace "buffed" with -- buried --
Line 63, replace "buffed" with -- buried --

Column 8,
Line 27, delete "could also"
Line 57, replace "some" with -- source --

Column 9,
Line 12, replace "come" with -- course --
Line 43, replace "droop" with -- drain --
Line 50, replace "some" with -- source --
Line 58, replace "dr" with -- drain --

Column 10,
Line 9, replace "provide" with -- provided --

Column 12,
Line 23, replace "some" with -- source --
Line 24, replace "3.k) " with -- 3.h) --
Line 66, replace "he" with -- be --

UNITED STATES PATENT AND TRADEMARK OFFICE
CERTIFICATE OF CORRECTION

PATENT NO.    : 5,688,722
DATED         : November 18, 1997
INVENTOR(S)   : Thomas E. Harrington, III It is certified that error appears in the above-identified patent and that said Letters Patent is hereby corrected as shown below:

Column 13,
Line 9, replace "some" with -- source --
Line 10, replace "comers" with -- corners --

Signed and Sealed this

Twenty-fifth Day of December, 2001

Attest:

JAMES E. ROGAN
Director of the United States Patent and Trademark Office

Attesting Officer